(12) United States Patent
Weimer et al.

(10) Patent No.: US 7,132,697 B2
(45) Date of Patent: Nov. 7, 2006

(54) NANOMATERIALS FOR QUANTUM TUNNELING VARISTORS

(76) Inventors: Alan W. Weimer, 6967 Springhill Dr., Niwot, CO (US) 80503; Steven M. George, 1444 Cassin Ct., Boulder, CO (US) 80303; Clinton Dutcher, 6635 S. New Haven Ave., Tulsa, OK (US) 74136-2843

( * ) Notice: Subject to any disclaimer, the term of this patent is extended or adjusted under 35 U.S.C. 154(b) by 0 days.

(21) Appl. No.: 10/773,688

(22) Filed: Feb. 6, 2004

(65) Prior Publication Data

US 2004/0159830 A1    Aug. 19, 2004

Related U.S. Application Data

(60) Provisional application No. 60/445,891, filed on Feb. 6, 2003.

(51) Int. Cl.
*H01L 29/72* (2006.01)
*B23B 5/16* (2006.01)

(52) U.S. Cl. ............... 257/173; 257/355; 428/402; 428/403

(58) Field of Classification Search ............... None
See application file for complete search history.

(56) References Cited

U.S. PATENT DOCUMENTS

| | | | |
|---|---|---|---|
| 3,647,358 A | | 3/1972 | Greenberg |
| 4,726,991 A | * | 2/1988 | Hyatt et al. ............ 428/329 |
| 4,977,357 A | | 12/1990 | Shrier |
| 4,992,333 A | | 2/1991 | Hyatt |
| 5,271,969 A | | 12/1993 | Ogura |
| 5,273,942 A | | 12/1993 | McCauley et al. |
| 5,705,265 A | | 1/1998 | Clough et al. |
| 5,985,175 A | | 11/1999 | Fan et al. |
| 6,613,383 B1 | * | 9/2003 | George et al. ........... 427/212 |
| 6,713,177 B1 | * | 3/2004 | George et al. ........... 428/402 |
| 6,913,827 B1 | * | 7/2005 | George et al. ........... 428/402 |
| 2003/0008186 A1 | | 1/2003 | George et al. |

OTHER PUBLICATIONS

Rony, Diffusion Kinetics Within Supported Liquid-Phase Catalysts, Journal of Catalysis 14, 142-147 (1969).
Yin et al., Study of Supported Liquid Phase Catalysts for Hydroformylation of Olefins Contained in FCC Dry Gas, Beijing, China, vol. 2, 614-620 (1991).
Wu et al., Catalytic Hydrodechlorination of CCL4 Over Silia-Supported PDCL2-Containing Molten Salt Catalysts: The Promotional Effects of COCL2 and CUCL2, Journal of Catalysis, 164-177 (1996).
Hoffmeister et al., The Influence of the Pore Structure of the Support on the Properties of Supported Liquid-Phase Catalysts, Chem. Engineering Science, vol. 45, No. 8, 2575-2580 (1990).
Kolodziej et al., A Study of the Internal Diffusion of Gases in Porous Catalysts in the Presence of a Liquid Phase, Chemical Engineering and Processing, 31, 255-261 (1992).
Jutka et al., Investigations on the Use of Supported Liquid-Phase Catalysts in Fluidized Bed Reactors, Institute for Technology, vol. 88, No. 289, 122-129.
Jelles et al., Supported Liquid Phase Catalysts, Studies in Surface Science and Catalysis, vol. 116, 667-674 (1998).
Freeman et al., Thermal Destruction of Hazardous Waste-A State of the Art View, Journal of Hazardous materials 14, 103-117 (1987).
Brusewitz et al., Problems in Use of Supported Liquid-Phase Catalysts in Fluidized Bed Reactors, Chem. Eng. Technol. 15, 385-389 (1992).
Johanson et al., Elimination of Hazardous Wastes by the Molten Salt Destruction Process, Rockwell International, 234-242.
Stelman et al., Treatment of Mixed Wastes by the Molten Salt Oxidation Process, Rockwell International, 795-799.
Upadhye, Molten Salt Destruction of Energetic Material Wastes as an Alternative to Open Burning, Chemistry for the Protection of the Environment 2, 267-276 (1996).
Upadhye, Molten Salt Takes the Bang Out of High Explosives, http://www.llnl.gov/str/upadhye.html, 1-4 (2000).
Klaus et al., Atomic Layer Controlled Growth of SIO2 Films Using Binary Reaction Sequence Chemistry, Appl. Phys. Lett. 70, 1092-1094 (1997).
Dillon et al., Surface Chemistry of AL2O3 Deposition Using AL(CH3)3 and H2O in a Binary Reaction Sequence, Surface Science 322, 230-242 (1995).
Sneh et al., Atomic Layer Growth of SIO2 on IS(100) Using SICL4 and H2O in a Binary Reaction Sequence, Surface Science 344, 135-152 (1995).
Joshi et al., Metal-Organic Surfactants as Sintering Aids for Silicon Nitride in an Aqueous Medium, J. Am. Ceram. Soc., 77(11) 2926-34 (1994).
Powell et al., Gas-Phase Coating of TiO2 with SiO2 in a Continuous Flow Hot-Wall Aerosol Reactor, J. Mater. Res. 12, pp. 552-559, Feb. 1997.
Weimer et al., Conforma Encapsulation of Fine Particles with Ceramic Nanolayers, AIChE 2001 Annual Meeting, Nov. 4-9, 2001, Reno, Nevada.
Klaus et al., SiO2 Chemical Vapor Deposition at Room Temperature Using SiCl4 and H20 with an NH3 Catalyst, J. Electrochem. Soc., 147(7) 2658-2664 (2000).
Powell et al., Synthesis of Alumina-and Alumina/Silica Coated Titania Particles in an Aerosol Flow Reactor, Chem. Mater. 1997, 9, 685-693.
Lange, Powder Processing Science and Technology for Increased Reliability, J. Am. Ceram. Soc. 72 (1) 3-15 (1989).
Powell et al., Coating of TiO2 Particles by Chemical Vapor Deposition, Chem. Vap. Deposition 1996, pp. 179-181.

* cited by examiner

*Primary Examiner*—Alonzo Chambliss
(74) *Attorney, Agent, or Firm*—Gary C Cohn PLLC

(57) ABSTRACT

So-called quantum tunneling varistors are made with a matrix of particles having a nonconductive coating that is deposited on core conductive particles using atomic layer deposition methods. The resulting coated particles have highly uniform, adherent coatings that allow easier production of good quality quantum tunneling varistor devices.

15 Claims, No Drawings

NANOMATERIALS FOR QUANTUM TUNNELING VARISTORS

CROSS-REFERENCE TO RELATED APPLICATION

This invention claims benefit of provisional application No. 60/445,891, filed Feb. 6, 2003.

BACKGROUND OF THE INVENTION

This invention relates to filler materials for certain types of overvoltage protection devices that are sometimes known as quantum tunneling varistors.

Transient electromagnetic conditions such as transient voltage and current spikes can damage circuitry or cause errors in their operation. Such electromagnetic transients can occur for a wide variety of reasons. Common sources are electromagnetic pulses (EMP), electrostatic discharges (ESD) and lightning. Electromagnetic pulses can be generated by thermonuclear explosions, high power microwaves or by other high-energy directed devices. Electrostatic discharge transients commonly arise in office, industrial and/or home environments from the accumulation of static charges. An ordinary example is a discharge of static electricity from a person wearing insulating clothing in a carpeted office. Another example is power line switching transients. EMP and ESD transients can generate peak voltage and/or current conditions within a few nanoseconds. Lightning generates peak voltages within a few microseconds. The time required for a transient to reach peak voltage and/or current conditions is referred to as the "rise time".

Various devices (so-called electrical overstress (EOS) protection devices) are known for protecting electronic circuitry from transient voltage and current conditions that exceed the capacity of the circuits. EOS protection devices generally shield electronic circuitry using two approaches. Devices like fuses and circuit breakers interrupt the connection between the circuit and the transient, thus isolating the circuit from the transient voltage. Such devices are very effective, but their response times are slow in comparison with the rise time of the transient. This results in an "overshoot" condition, where voltages much greater than the protection voltage are temporarily seen before the EOS protection device responds and diverts the transient to ground. This overshoot can cause the circuit to become damaged despite the presence of the EOS protection device. In addition, these devices usually must be replaced or reset after the transient event is over in order to restore the circuit to operation.

Other EOS protection devices operate by diverting the transient current to ground. Varistors are examples of this type of device. A varistor has a property known as "non-linear resistance", or "NLR". At low applied voltages, the varistor provides high resistance and acts essentially like an open circuit. Above a certain characteristic voltage threshold (known as a "protection voltage"), the resistance reduces quite substantially. When a transient is experienced, the protection voltage is exceeded and the varistor resistance drops. This allows current to flow through the varistor to ground rather than through the circuits.

A particular type of varistor is known as a metal insulator varistor (MIV). MIVs depend on micron sized, insulator coated particles embedded in a moldable polymeric binder. The insulator coatings and the binder material provide electrical resistance, which is overcome when a protection voltage is exceeded. Coating thicknesses are typically of the order of 5 to 1000 nm.

MIV devices in which the coating is sufficiently thin are known as "quantum tunneling" varistors. These devices are described, for example, in U.S. Pat. Nos. 4,726,991, 4,977,357 and 4,992,333. These devices consist of fine conductor particles in a binder material. In some cases, semiconductor particles are also used. The conductor particles (and semiconductor particles, when present) are separated from each other by distances that are on the order of 100–1000 nm. The material separating the conductor particles is nonconductive. Above a certain protection voltage, current will flow from particle to adjacent conductor particle, through the intervening nonconductive material, via a process known as quantum tunneling. Quantum tunneling behavior is explainable through a probabilistic model of electron behavior, and electrons traverse the intervening nonconductive material by tunneling rather than because their energies exceed the energy barrier imposed by the nonconductive material.

Quantum tunneling varistors offer the possibility of extremely rapid response times that are on the order of the rise times of EMP and ESD transients. This would largely eliminate "overshoot" conditions. In principle, quantum tunneling varistors will provide a highly nonlinear resistance with very high resistance at system operating voltages and low resistance at transient voltage conditions.

The operation of quantum tunneling varistors, as described in U.S. Pat. Nos. 4,726,991, 4,977,357 and 4,992,333, depends on the careful, uniform spacing of the conductor (and semiconductor) particles. The desired quantum tunneling effect is achieved only when these particles are spaced apart at particular distances. The quantum tunneling effect does not occur at all if this spacing is too great. When conductor and semiconductor particles are in contact with each other, a conductive path forms through the varistor even at low voltages. When the spacing is not highly uniform, numerous conductive pathways form at different voltages. As a result, the varistor does not exhibit a clear protection voltage above which resistance drops in a non-linear fashion. Instead, resistance tends to decrease more linearly with increased voltage.

U.S. Pat. Nos. 4,726,991, 4,977,357 and 4,992,333 describe different approaches to obtaining the desired spacing. These can be summarized generally as (1) coating the particles, (2) separating the particles with a non-conductive binder material and (3) separating the particles with fine particles of a non-conductive material. It is very difficult to obtain uniform particle spacing, as this depends on obtaining an almost perfectly uniform distribution of the particles in a binder matrix. Properly coated particles would in principle not require such careful control over particle spacing, but these patents do not describe any method by which effective coatings could be applied. As a result, the coated particle approach is combined with other approaches, such as the use of a nonconductive binder and additional semiconductor particles, to attempt to obtain the desired particle spacing.

Attempts have been made to make coated particles for MIV applications, using a solution chemistry approach. The resultant particles are generally not uniformly coated, nor are the coatings well adhered to the underlying base particle. The non-uniformity leads to statistical variation between the current paths in the varistor material and ultimately to what is called dominant path failure. The poor adhesion of the coating leads to damage during the manufacturing process. The combination of these two problems results in product variability and low production yields.

It is desirable to provide a non-linear resistance material that provides a rapid response time and good nonlinear resistance properties, and can be made easily and reproducibly.

SUMMARY OF THE INVENTION

This invention is a non-linear resistive device comprising first and second electrodes connected through an electrical pathway that includes a particle matrix containing coated conductive particles having a conductive core and a nonconductive coating formed in an atomic layer deposition process covering the entire surface of the conductive core, wherein said coating has a thickness of about 0.25 to about 500 nm, and said particle matrix exhibits non-linear resistance.

The device of the invention exhibits a response time on the order of nanoseconds or less. It is capable of being manufactured easily and reproducibly. The device is therefore useful for protecting electronic circuitry from many types of electrical transients, including lightning, EMP and ESD transients. It is also useful as a high speed electrical switching device, in strip lines, PCB materials, cables, coaxial connectors, as well as in other applications where variable resistance is desired.

DETAILED DESCRIPTION OF THE INVENTION

The particle matrix consists of a mass of coated conductive particles having a conductive core and a nonconductive coating. The diameter of the coated particle depends on the particular electrical properties desired. In general, the diameters range from nanometer to micron scale. For example, the coated conductive particle may have a diameter from about 10 nanometers to 500 microns, such as from about 100 nanometers to 250 microns, from about 250 nanometers to 200 microns or from about 10 to about 200 microns. The preferred coated particle sizes will depend somewhat on the desired properties of the particle matrix and the particular application.

The coating provides electrical insulation between the conductive cores of adjacent particles in the particle matrix and contributes significantly to the non-linear resistivity of the matrix. A threshold applied voltage is required to establish a significant current through the non-conductive coating. The magnitude of that voltage will increase in relation to the coating thickness. When coating thickness is small enough, on the order of 0.5 to 100 nm, it is believed that the non-linear resistivity of the particle matrix is due to quantum tunneling effects. The quantum tunneling transports electrons from the conductive core of one particle, through that particle's nonconductive coating, through any intervening space, and then through the nonconductive coating of an adjacent particle to the conductive core of the adjacent particle. In this way, a current path is generated from particle to particle through the particle matrix when a sufficiently high voltage is applied. The spacing from conductive particle core-to-conductive particle core must be below a threshold level for the quantum tunneling effect to take place. Below the threshold level, the spacing affects the applied voltage that is required to achieve the quantum tunneling effect, with smaller spacings requiring smaller applied voltages. The coating thickness is preferably such that this spacing exists when adjacent particles are in physical contact, i.e, the coating thickness is approximately ½ of the desired core-to-core spacing. Therefore, coating thickness is generally from about 0.25–500 nm. The coating may be at least 1 nanometer thick, and may be at least about 2 nanometers thick, and may be at least about 5 nanometers thick. The coating may be up to about 200 nm thick, and may be up to about 150 nanometers thick and may be up to 100 nanometers thick.

Because the core-to-core spacing can be in effect controlled through coating thickness, the performance of the matrix is much less sensitive to precise distributions of particles within the matrix than previous MIV devices. In particular, is it usually not necessary to separate individual particles with small nonconductor particles or precise thicknesses of a binder material. Instead, the particles can be closely packed within the matrix so that most particles are in contact with at least one adjacent particle. These points of contact create a number of particle chains that provide conductive paths through the matrix once the protection voltage is exceeded. Typically, good results are achieved when the coated particles constitute at least 50%, especially at least 70% of the volume of the matrix.

The remaining volume of the particle matrix (except when semiconductor particles are included as described below) is a nonconducting material (binder) or vacuum. A binder material will generally have a resistivity of about $10^{12}$ to $10^{15}$ ohms/cm or greater. It may be a solid material, in particular a rubber, a thermoplastic resin or a thermosetting resin such as an epoxy resin. Insulating ceramic materials are also useful binder materials. A solid binder material allows the particle matrix to be molded or shaped into a variety of shapes and sizes for particular applications. These binder may contain various additives that affect their resistance, which in turn can affect device performance. Examples are plasticizers and coupling agents, which may constitute up to 10% or more of the weight of the binder material. Suitable fluid binder materials include water, hydrocarbon or silicone oils, air, nitrogen or $SF_6$. If the binder material is fluid, the particle matrix must be held in a container.

Suitable conductive core materials have resistivities in the range from about $10^{-1}$ to about $10^{-6}$ ohms/cm. Examples of such materials include metals such as copper, aluminum, nickel (including carbonyl nickel) molybdenum, silver, gold, zinc, cadmium, iron, tin, beryllium and lead; alloys of one or more of the foregoing metals, steel, bronze, brass and Mu-metal; various carbides such as titanium carbide, columbian carbide, tantalum carbide, tungsten carbide and zirconium carbide; and various metal silicides such as described in *Silicides for VLSI Applications*, S. P. Murarka (Academic Press, 1983), pp. 30–31. The conductive core particle preferably has a somewhat rounded shape with few if any sharp or highly angular surfaces. Approximately spherical particles are preferred.

Suitable coating materials have resistivities in the range of about $10^{12}$ to $10^{15}$ ohms/cm or greater and are susceptible to being applied by an atomic layer deposition process. Suitable coatings include inorganic coatings. Coatings of particular interest include $Al_2O_3$ (alumina), $SiO_2$ (silica), $Hf_2O_3$, $ZrO_2$ (zirconia), and $TaO_2$. $TiO_2$ (titania is a suitable coating material if the device is not to be used in high temperature applications.

The coating layers are deposited in an atomic layer deposition process, using the core particles as a substrate. A suitable ALD process for depositing nanocoatings on fine particles is described in U.S. Pat. No. 6,613,383 and WO 03/008186A1. In the ALD process, the coating-forming reaction is conducted as a series of (typically two) half-reactions. In each of these half-reactions, a single reagent is introduced into contact with the substrate particle surface under conditions such that the reagent is in the form of a gas. The reagent reacts with functional groups on the surface of the particle and becomes bound to the particle. Excess amounts of the reagent are removed. Each remaining half-reaction is then conducted in turn, each time introducing a single reagent, allowing it to react at the surface of the particle, and removing excess reactant before introducing the next reagent. Usually, a carrier gas is used to introduce the reagents, and the reaction chamber is swept with the carrier gas between successive reagent introductions to help remove excess reagents and gaseous reaction products. Also, in some instances a precursor reaction may be done to introduce desirable functional groups onto the surface of the underlying particle, to provide a mechanism for covalently bonding the coating to the particle (or an underlying deposited layer).

Atomic layer controlled growth techniques permit the deposition of coatings of up to about 0.4 nm in thickness per reaction cycle, and thus provide a means of extremely fine control over coating thickness. Thicker coatings can be prepared by repeating the reaction sequence to sequentially deposit additional layers of the coating material until a desired coating thickness is achieved.

A convenient method for applying the coating to the base particles is to form a fluidized bed of the particles, and then pass the various reagents in turn through the fluidized bed under reaction conditions. Methods of fluidizing particulate materials are well known, and generally include supporting the particles on a porous plate or screen. A fluidizing gas is passed upwardly through the plate or screen, lifting the particles somewhat and expanding the volume of the bed. With appropriate expansion, the particles behave much as a fluid. Fluid (gaseous or liquid) reagents can be introduced into the bed for reaction with the surface of the particles. In this invention, the fluidizing gas also can act as an inert purge gas for removing unreacted reagents and volatile or gaseous reaction products.

In addition, the reactions can be conducted in a rotating cylindrical vessel or a rotating tube. This method is particularly suitable for continuous processes.

Oxide coatings can be prepared on particles having surface hydroxyl or amine (M-N-H) groups using a binary (AB) reaction sequence as follows. The asterisk (*) indicates the atom that resides at the surface of the particle or coating, and Z represents oxygen or nitrogen from the surface hydroxyl or amine group. $M^1$ is an atom of a metal (or semimetal in the case of silicon), and X is a displaceable nucleophilic group. The reactions shown below are not balanced, and are only intended to show the reactions at the surface of the particles (i.e., not inter- or intralayer reactions).

$$M\text{-}Z\text{-}H^* + M^1X_n \rightarrow M\text{-}Z\text{-}M^1X^* + HX \tag{A1}$$

$$M\text{-}Z\text{-}M^1X^* + H_2O \rightarrow M\text{-}Z\text{-}M^1OH^* + HX \tag{B1}$$

In reaction A1, reagent $M^1X_n$ reacts with one or more M-Z-H* groups on the surface of the particle to create a new surface group having the form -$M^1$-X. $M^1$ is bonded to the particle through one or more Z (nitrogen or oxygen) atoms. The -$M^1$-X group represents a site that can react with water in reaction B1 to regenerate one or more hydroxyl groups. The surface hydroxyl groups formed in reaction B1 can serve as functional groups through which reactions A1 and B1 can be repeated, each time adding a new layer of $M^1$ atoms. Note that hydroxyl groups can be eliminated as water, forming $M^1$-O-$M^1$ bonds within or between layers.

This condensation reaction can be promoted if desired by, for example, annealing at elevated temperatures and/or reduced pressures.

For $Al_2O_3$, a preferred binary reaction sequence is:

$$M\text{-}Z\text{-}H^* + AlCl_3 \rightarrow M\text{-}Z\text{-}AlCl_2^* + HCl \tag{A2}$$

$$M\text{-}Z\text{-}AlCl^* + H_2O \rightarrow M\text{-}Z\text{-}AlOH^* + HCl \tag{B2}$$

Another preferred binary reaction sequence for producing alumina is described by Ott et al., *Thin Solid Films* 292 (1997) 135–144. That process uses trimethyl aluminum as a starting material in the following sequence:

$$M\text{-}Z\text{-}H^* + Al(CH_3)_3 \rightarrow M\text{-}Z\text{-}Al(CH_3)_2^* + CH_4 \tag{A3}$$

$$M\text{-}Z\text{-}Al(CH_3)_2^* + H_2O \rightarrow M\text{-}Z\text{-}AlOH^* + CH_4 \tag{B3}$$

For $SiO_2$, a preferred binary reaction sequence is $$M\text{-}Z\text{-}H^* + SiCl_4 \rightarrow M\text{-}Z\text{-}SiCl_3^* + HCl \tag{A4}$$

$$M\text{-}Z\text{-}SiCl^* + H_2O \rightarrow M\text{-}Z\text{-}SiOH^* + HCl \tag{B4}$$

For $ZrO_2$, a preferred binary reaction sequence is $$M\text{-}Z\text{-}H^* + ZrCl_4 \rightarrow M\text{-}Z\text{-}ZrCl_3^* + HCl \tag{A5}$$

$$M\text{-}Z\text{-}ZrCl^* + H_2O \rightarrow M\text{-}Z\text{-}ZrOH^* + HCl \tag{B5}$$

For $TiO_2$, a preferred binary reaction sequence is:

$$M\text{-}Z\text{-}H^* + TiCl_4 \rightarrow M\text{-}Z\text{-}TiCl_3^* + HCl \tag{A6}$$

$$M\text{-}Z\text{-}TiCl^* + H_2O \rightarrow M\text{-}Z\text{-}TiOH^* + HCl \tag{B6}$$

Binary reactions of the general type described by equations A1 and B1, where $M^1$ is silicon, are described more fully in J. W. Klaus et al, "Atomic Layer Controlled Growth of $SiO_2$ Films Using Binary Reaction Sequence Chemistry", *Appl. Phys. Lett.* 70, 1092 (1997) and O. Sheh et al., "Atomic Layer Growth of $SiO_2$ on Si(100) and $H_2O$ using a Binary Reaction Sequence", *Surface Science* 334, 135 (1995), both incorporated herein by reference. Analogous reactions for the deposition of other metal oxides such as $ZrO_2$ and $TiO_2$ are described in Tsapatsis et al. (1991) *Ind. Eng. Chem. Res.* 30:2152–2159 and Lin et al., (1992), *AIChE Journal* 38:445–454, both incorporated herein by reference. An ALD process of this general type for producing alumina films is described by Ritala et al., *Thin Solid Films* 286 (1996) 54–58.

Another binary reaction sequence for producing $ZrO_2$ uses tetradiethylaminozirconium and water as reagents, as follows:

$$MOH^* + Zr[N(CH_2CH_3)_2]_4 \rightarrow MO\text{-}Zr[N(CH_2CH_3)_2]_3^* + HN(CH_2CH_3)_2 \tag{A7}$$

$$MO\text{-}ZrN(CH_2CH_3)_2^* + H_2O \rightarrow MO\text{-}ZrOH^* + HN(CH_2CH_3)_2 \tag{B7}$$

In addition, catalyzed binary reaction techniques such as described in U.S. Pat. No. 6,090,442, entitled "Method of Growing Films on Substrates at Room Temperatures Using Catalyzed Binary Reaction Sequence Chemistry", incorporated by reference, are suitable for producing coatings, especially oxide, nitride or sulfide coatings, most preferably oxide coatings. Reactions of this type can be represented as follows:

$$M\text{-}F_1 + C_1 \rightarrow M\text{-}F_1 \ldots C_1 \tag{A8a}$$

$$M\text{-}F_1 \ldots C_1 + F_2\text{-}M^1\text{-}F_2 \rightarrow M\text{-}M^1\text{-}F_2 + F_1\text{-}F_2 + C_1 \tag{A8b}$$

$$M\text{-}M^1\text{-}F_2 + C_2 \rightarrow M\text{-}M^1\text{-}F_1 \ldots C_2 \tag{B8a}$$

$$M\text{-}M^1\text{-}F_1 \ldots C_2 + F_1\text{-}M\text{-}F_1 \rightarrow M\text{-}M^1\text{-}M\text{-}F_1 + F_1\text{-}F_2 + C_2 \tag{B8b}$$

$C_1$ and $C_2$ represent catalysts for the A8b and B8b reactions, and may be the same or different. $F_1$ and $F_2$ represent functional groups, and M and $M^1$ are as defined before, and can be the same or different. Reactions A8a and A8b together constitute the first part of a binary reaction sequence, and reactions B8a and B8b together constitute the second half of the binary reaction sequence. An example of such a catalyzed binary reaction sequence for producing $SiO_2$ coatings is:

Si—OH*(particle)+$C_5H_5N$→Si—OH ... $C_5H_5N$* (A9a)

Si—OH ... $C_5H_5N$*+$SiCl_4$→Si—O—$SiCl_3$*+ $C_5H_5N$+HCl (A9b)

Si—O—$SiCl_3$+$C_5H_5N$→Si—O—$SiCl_3$ ... $C_5H_5N$* (B9a)

Si—O—$SiCl_3$ ... $C_5H_5N$*+$H_2O$→Si—O—SiOH*+ $C_5H_5N$+HCl (B9b)

where the asterisks (*) again denote atoms at the surface of the particle. C5H5N is a catalyst for each of the half-reactions in this sequence. This general method is also applicable to forming various other nonconductive oxide coatings.

Except for the catalyzed reaction scheme described above, the binary reactions are generally performed at elevated temperatures, preferably from about 400–1000K. Between reactions, the particles are subjected to conditions sufficient to remove reaction products and unreacted reagents. This can be done, for example, by subjecting the particles to a high vacuum, such as about $10^{-5}$ Torr or less, after each reaction step. Another method of accomplishing this, which is more readily applicable for industrial application, is to sweep the particles with an inert purge gas between the reaction steps. This purge gas can also act as a fluidizing medium for the particles and as a carrier for the reagents.

Several techniques are useful for monitoring the progress of the reaction. For example, vibrational spectroscopic studies can be performed on high surface area silica powders using transmission Fourier transform infrared techniques. The deposited coatings can be examined using in situ spectroscopic ellipsometry. Atomic force microscopy studies can be used to characterize the roughness of the coating relative to that of the surface of the substrate. X-ray photoelectron spectroscopy and x-ray diffraction can by used to do depth-profiling and ascertain the crystallographic structure of the coating.

The particulates are preferably non-agglomerated after the coating is deposited. By "non-agglomerated", it means that the particles do not form significant amounts of agglomerates during the process of coating the substrate particles. Particles are considered to be non-agglomerated if (a) the average particle size does not increase more than about 5%, preferably not more than about 2%, more preferably not more than about 1% (apart from particle size increases attributable to the coating itself) as a result of depositing the coating, or (b) if no more than 2 weight %, preferably no more than 1 weight % of the particles become agglomerated during the process of depositing the inorganic material.

The particle coating layers preferably cover the entire surface of the base particles and are preferably conformal. By "conformal" it is meant that the thickness of the coating layer is relatively uniform across the surface of the particle (so that, for example, the thickest regions of the coating are no greater than 3× the thickness of the thinnest regions), so that the surface shape of the coated substrate closely resembles that of the underlying substrate surface. Conformality is determined by methods such as transmission electron spectroscopy (TEM) that have resolution of 10 nm or below. Lower resolution techniques cannot distinguish conformal from non-conformal coatings at this scale. The desired substrate surface is preferably coated substantially without pinholes or defects. If necessary, impurities such as organics are removed from the surface of the particles before starting the ALD process, so that all surfaces are covered.

It is possible to incorporate semiconductor particles into the particle matrix, in addition to or as a substitute for a portion of the coated conductive particles described above. Semiconductor particles are believed to act as individual non-linear resistance elements, with their number and composition in many cases establishing the bulk resistance of the particle matrix. When used, such semiconductor particles are preferably coated with a nonconductive coating as described above. Thus, the coated semiconductor particles include a semiconductor base particle and a nonconductive coating. Particle sizes and coating thicknesses are conveniently as discussed above with regard to the coated conductor particles. Semiconductor base particles include silicon carbide, beryllium carbide, calcium oxide, chalcogenides, doped silicon, niobium oxide, vanadium oxide, indium antimonide, iron oxide, boron carbide, selenium, lead sulphide, lead telluride, cadmium sulphide, zinc sulphide, silver sulphide, boron, tellurium, germanium, and vanadium carbide. Titanium dioxide is a suitable semiconductor material for high temperature applications.

When semiconductor particles are used, they may replace from about 1 to about 80% of the volume of the coated conductive particles. Coated conductive particles and semiconductor particles (preferably coated) will together generally constitute about 50% or more, such as about 70% or more of the volume of the particle matrix. Volume ratios of coated conductive particles to semiconductor particles are typically from about 4:1 to 1:4.

The electrical characteristics of the particle matrix will of course be dependent on various factors such as the selection of conductive core material, particle size, nonconductive coating material, thickness of nonconductive coating material, the concentration of coated conductive particles in the matrix, the presence of semiconductor particles and proportion thereof, and the selection and proportion of binder material. Manipulation of these parameters allows the designer to establish the protection voltage, device response time, impedence capacitance, bulk resistance above the protection voltage, and energy carrying capacity of the particle matrix. Lower protection voltages are generally favored by (1) increased coated conductive particle concentration, (2) decreased semiconductor particle concentration, relative to coated conductive particle concentration, (3) smaller spacing between conductive particles, (4) smaller nonconductive coating thicknesses and/or (5) a lesser proportion of binder material. Desired protection voltages will of course vary by application. For microelectronics, protection voltages are often in the range of 3–10 volts. For larger electronics, protection voltages may be 100V or more or even 1000V or more.

Device response times less than 10 nanoseconds, such as less than 2 nanoseconds and such as less than 1 nanosecond can be achieved. As discussed before, it is believed that extremely short device response times are favored when current flow through the matrix is through a quantum tunneling effect. This mechanism of operation is especially favored when the core-to-core spacing of coated conductive particles is in the range of about 0.5–100 nm.

The device of the invention is conveniently made by forming the particle matrix into the desired physical form (i.e, shape and size), and attaching the electrodes in electrical connection to the particle matrix. The electrodes are placed in relation to the particle matrix such that the electrical pathway between the electrodes passes through the particle matrix. The mass of the particle matrix will generally determine the amount of current that can flow between the electrodes when the protection voltage is exceeded. Small masses of particle matrix are sufficient to protect individual microelectronic components, whereas the required volume of particle matrix is more substantial when protecting large circuits such as a massive antenna. The particle matrix will typically conduct from about 0.5 to several hundred joules of energy per cubic centimeter of particle matrix volume. This value will depend somewhat on the particle materials used in making the particle matrix.

When used as a typical EOS protection device, one electrode of the device is in electrical connection with an electrical line supplying current to the electrical circuitry to be protected. The other electrode of the device runs to ground. A simple configuration of the EOS device is to encapsulate a power line with a mass of the particle matrix, and connecting the exterior of the particle mass to ground. In this configuration, the power line acts as one electrode of the EOS protection device. During normal operation at voltages below the protection voltage, the resistance of the particle matrix is high enough that negligible current is conducted through the device. When a transient occurs that exceeds the protection voltage, the resistance of the particle matrix reduces substantially, opening an electrical pathway to ground and therefore shunting the transient current to ground. This shunt current will continue as long as the voltage exceeds the protection voltage of the particle matrix. When the transient has diminished below the protection voltage, current flow through the particle matrix discontinues, and normal current flow resumes to the protected device. The particle matrix is thereafter ready to respond to further upset conditions, unless it was damaged by the first transient. The main failure mode of the particle matrix will usually be melting of the conductor particles. This is disfavored due to the high melting temperature and high heat of fusion of most metal conductors.

The coated particles used in this invention are very uniformly coated due to the use of the atomic layer deposition process. This process also creates coatings that adhere well to the base particle. These particle characteristics allow the particle to be more easily loaded into a binder material at high concentrations at or above the percolation limit. This high loading allows substantially all particles to be in actual or near contact with neighboring particles, so that the core-particle-to-core particle distances are mainly controlled by the coating thicknesses.

The following examples are provided to illustrate the invention. These examples are not intended to limit the scope of the inventions. All parts and percentages are by weight unless otherwise indicated.

EXAMPLE 1

Nanocoating 5 Micron Sized Iron Particles with $Al_2O_3$

Fine iron particles are coated with several different thicknesses of alumina via the ALD process in a vibrating fluidized bed. The iron particles have a very thin hematite layer due to surface oxidation. The reactants are trimethyl aluminum and water. The fluidized bed is 5.1 cm in diameter and 91.4 cm long. The reactor itself is composed of stainless steel and is encased by a clamshell-type furnace. Separate reactant bubblers for each of the reagents are attached to the system via their vent lines, and are operated by the driving force of their vapor pressures. Two sets of solenoid valves allow the reagents to be sequentially dosed into the system. The fluidizing gas flow is maintained using a mass flow controller from MKS instruments. An additional mass flow controller controls a separate purge flow through the dosing lines. The dosing line entrance into the reactor is just beneath a removable porous metal fluidized bed distributor plate. With the fluidizing gas, each dosing reagent can be pulsed into the system and then purged with $N_2$ to remove it from the system prior to the next dose of the other reactant. In this manner, ALD sequential surface chemistry is easily carried out and undesirable CVD (chemical vapor deposition) is avoided. The reactor itself is maintained at low pressure near vacuum using a large (Alcatel 2063AC) pump, and the dosing lines can also be pumped down using smaller (Alcatel 2008a) separate vacuum pumps. The reaction sequence is carried out at a temperature of 450 K. A pulsating magnet near the upper surface of the fluidized bed prevents iron particles from being entrained out of the fluidized bed.

Reactant exposures are approximately $1 \times 10^6$ Langmuirs (1 L=$10^{-6}$ Torr·s) per cycle. Separate runs are made in which 5, 10, 25, 50, 75, and 100 reaction cycles, respectively are completed. Another run in which 175 reaction cycles are conducted is done for transmission electron microscopy analysis. Inductively Coupled Plasma—Atomic Emission Spectroscopy (ICP-AES) analysis shows an increasing trend in film thickness with each successive number of cycles. The ICP-AES data for 5 cycles and 10 cycles give nearly identical results, as set forth in Table 1 below. This is believed to be because the ALD process may take up to 10 cycles to initially achieve complete surface coverage. The consistency of the analysis for several different repeated experiments for 25, 50, 75, and 100 TMA/$H_2O$ cycles is quite good.

TABLE 1

| Number of Reaction Cycles | mg Al deposited/kg Fe | Particle Surface Area |
|---|---|---|
| 0 | 0 | 3.0 |
| 5 | 380 | N. D. |
| 10 | 500 | 2.9 |
| 25 | 1700 | 2.6 |
| 50 | 2900 | 2.5 |
| 75 | 4200 | 3.4 |
| 100 | 6100 | 2.6 |

TEM images of the particles coated with 175 reaction cycles show an extremely conformal, ~22 nm alumina film. This thickness is within the previously observed range for growth rates which vary from 0.8–1.2 Å per cycle. Parallel Detection Electron Energy Loss Spectroscopy (PEELS) spectra indicate a crystalline alumina coating. No iron is detected by PEELS. This indicates complete coverage of iron particles with $Al_2O_3$.

An X-Ray Diffraction (XRD) pattern (Co source) identifies both hematite ($\alpha$-$Fe_2O_3$) and alumina ($\gamma$-$Al_2O_3$) crystal structures. This confirms that crystalline $\gamma$-$Al_2O_3$ is being grown on the surface of the particles at this reaction temperature (450 K). The peak widths are unusually narrow, suggesting that the gamma-alumina structure has higher than normal crystalline perfection. This may be due to the hematite surface layer of the iron particles acting as a "template" for crystalline alumina growth, causing the alumina to "line up" with the hematite.

Particle size distribution and surface area analyses are performed to ensure the coating is not binding the individual particles into aggregates. The surface area analysis is reported in Table 1. The particle size distribution does not change significantly from that of the base particles. No significant change in the surface area is seen for any of the coated samples, which again indicates a lack of particle agglomeration during the coating process.

EXAMPLE 2

Pulse Evaluation of Nanocoated Iron Particles

Powder samples from Example 1, coated with 50 cycles in the ALD coated process are evaluated for non-linear resistance. The coated powder is blended with the minimum amount of ECO-COAT necessary to make a thick paste. This paste is then cured into the test cell in order to form the sample for electromagnetic testing. A ~65 nanosecond square wave is applied to the particles. Peak input voltages are 500V, 1000V, 2000V, 4000V and 5000V. Output voltages are measured as in indication of the resistivity of the particles at these applied voltages. At 500V input voltage, output voltage is ~500 volts, indicating the the resistivity is very high at this applied voltage. At 1000V input, output is about 800 volts, indicating a ~20% voltage reduction and decreased resisitivity. At 2000V input, output is about 1250 volts, indicating a ~37% reduction in voltage and further decreased resistivity. At 4000V, output voltage is about 1500V, or about a 62% voltage reduction. At 5000 V input, output voltage is reduced to ~1750 volts, representing a 65% voltage reduction. The response time is measured to be less than 1 nanosecond and no measurable overshoot is detected.

What is claimed is:

1. A non-linear resistive device comprising a first electrode and a second electrode connected through an electrical pathway that includes a particle matrix, containing coated conductive particles having a conductive core and a nonconductive coating formed in an atomic layer deposition process covering the entire surface of the core, wherein said coating has a thickness of about 0.5 to about 100 nm, and said particle matrix exhibits non-linear resistance.

2. The device of claim 1 wherein the particle matrix includes a polymeric binder.

3. A non-linear resistive device according to claim 2 wherein the particles are loaded into the polymeric binder at or above the percolation limit.

4. The device of claim 2 wherein core-to-core distances between adjacent particles are determined by the thicknesses of the coatings on the adjacent particles.

5. The device of claim 1 wherein the particle matrix further comprises semiconductor particles that are coated with a nonconductive coating formed in an atomic layer deposition process.

6. The device of claim 5, wherein the coated conductive particles and semiconductor particles together constitute 70% or more of the volume of the particle matrix.

7. The device of claim 1 wherein the conductive core is copper, aluminum, nickel, carbonyl nickel, molybdenum, silver, gold, zinc, cadmium, iron, tin, beryllium, lead; an alloy of one or more of the foregoing metals, steel, bronze, brass, Mu-metal, titanium carbide, columbian carbide, tantalum carbide, tungsten carbide, zirconium carbide or a conductive metal silicide.

8. The device of claim 7, wherein the nonconductive coating is $Al_2O_3$, $SiO_2$, $Hf_2O_3$, $ZrO_2$, or $TaO_2$.

9. The device of claim 8, wherein the coating thickness is from about 0.5 to about 100 nm.

10. The device of claim 9 wherein the core is iron, nickel or gold and the nonconductive coating is $Al_2O_3$ or $SiO_2$.

11. A method for protecting an electronic circuit from a transient electrical voltage, comprising electrically connecting one electrode of the device of claim 1 to a power source for the electronic circuit, and the other electrode of the device of claim 1 to ground.

12. The device of claim 1, wherein the particle matrix contains at least 50 volume % of the coated conductive particles.

13. The device of claim 12, wherein the particle matrix contains at least 70 volume % of the coated conductive particles.

14. The device of claim 1, wherein the nonconductive coating is conformal.

15. A process for making a device of claim 1, comprising
 a) forming a nonconductive coating on a core conductive particle via an atomic layer deposition process, such that entire surface of the core particles become covered by the nonconductive coating;
 b) forming the coated core particles from step a) into a matrix material and
 c) attaching the particle matrix in electrical connection to a first electrode and a second electrode such that the first and second electrodes are connected through an electrical pathway that includes the particle matrix.

* * * * *